(12) United States Patent
Hong et al.

(10) Patent No.: US 12,249,603 B2
(45) Date of Patent: Mar. 11, 2025

(54) RESISTOR STRUCTURES OF INTEGRATED CIRCUIT DEVICES INCLUDING STACKED TRANSISTORS AND METHODS OF FORMING THE SAME

(71) Applicant: Samsung Electronics Co., Ltd., Suwon-si (KR)

(72) Inventors: Byounghak Hong, Albany, NY (US); Seungchan Yun, Waterford, NY (US); Inchan Hwang, Schenectady, NY (US); Hyoeun Park, Cohoes, NY (US); Kang-ill Seo, Albany, NY (US)

(73) Assignee: SAMSUNG ELECTRONICS CO., LTD. (KR)

( * ) Notice: Subject to any disclaimer, the term of this patent is extended or adjusted under 35 U.S.C. 154(b) by 215 days.

(21) Appl. No.: 17/570,920

(22) Filed: Jan. 7, 2022

(65) Prior Publication Data

US 2023/0135219 A1 May 4, 2023

Related U.S. Application Data

(60) Provisional application No. 63/273,246, filed on Oct. 29, 2021.

(51) Int. Cl.
| | |
|---|---|
| *H01L 27/06* | (2006.01) |
| *H01L 25/07* | (2006.01) |
| *H01L 27/07* | (2006.01) |
| *H01L 27/08* | (2006.01) |
| *H01L 49/02* | (2006.01) |

(52) U.S. Cl.
CPC ........ *H01L 27/0738* (2013.01); *H01L 25/074* (2013.01); *H01L 27/0688* (2013.01); *H01L 27/0802* (2013.01); *H01L 28/20* (2013.01)

(58) Field of Classification Search
CPC ............ H01L 27/0688; H01L 27/0738; H01L 27/0802; H01L 28/20; H01L 23/647
See application file for complete search history.

(56) References Cited

U.S. PATENT DOCUMENTS

| | | |
|---|---|---|
| 7,238,582 B2 | 7/2007 | Shimamoto et al. |
| 7,242,074 B2 | 7/2007 | Erickson et al. |
| 7,402,871 B2 | 7/2008 | Song |
| | (Continued) | |

FOREIGN PATENT DOCUMENTS

| | | |
|---|---|---|
| CN | 214043665 U | 8/2021 |
| JP | 2008071925 A | 3/2008 |
| JP | 4218926 B2 | 2/2009 |

OTHER PUBLICATIONS

Extended European Search Report corresponding to EP 22204350.7, mailed Mar. 16, 2023 (8 pages).

*Primary Examiner* — Tucker J Wright
(74) *Attorney, Agent, or Firm* — Myers Bigel, P.A.

(57) ABSTRACT

Resistor structures of stacked devices and methods of forming the same are provided. The, resistor structures may include a substrate, an upper semiconductor layer that may be spaced apart from the substrate in a vertical direction, a lower semiconductor layer that may be between the substrate and the upper semiconductor layer, and first and second resistor contacts that may be spaced apart from each other in a horizontal direction. At least one of the upper semiconductor layer, the lower semiconductor layer, and a portion of the substrate may contact the first and second resistor contacts.

20 Claims, 23 Drawing Sheets

(56) References Cited

U.S. PATENT DOCUMENTS

| | | |
|---|---|---|
| 7,551,055 B2 | 6/2009 | Lee |
| 7,910,973 B2 | 3/2011 | Sakaguchi et al. |
| 7,973,552 B2 | 7/2011 | Chen |
| 8,350,333 B2 | 1/2013 | Ishihara et al. |
| 8,889,487 B2 | 11/2014 | Mallikarjunaswamy |
| 9,018,610 B2 | 4/2015 | Park et al. |
| 9,659,999 B2 | 5/2017 | Park |
| 9,852,830 B2 | 12/2017 | Hsieh |
| 10,461,075 B2 | 10/2019 | Mcmullan et al. |
| 2005/0156281 A1 | 7/2005 | Eshun et al. |
| 2006/0164202 A1* | 7/2006 | Lee ................ H01C 13/02 257/E27.047 |
| 2006/0194436 A1* | 8/2006 | Oh ................ H01L 27/08 438/689 |
| 2007/0284662 A1 | 12/2007 | Chinthakindi et al. |
| 2018/0061929 A1 | 3/2018 | Bi et al. |
| 2021/0028164 A1 | 1/2021 | Shin et al. |

* cited by examiner

RESISTOR STRUCTURES OF INTEGRATED CIRCUIT DEVICES INCLUDING STACKED TRANSISTORS AND METHODS OF FORMING THE SAME

CROSS-REFERENCE TO RELATED APPLICATION

This application claims priority to U.S. Provisional Application Ser. No. 63/273,246, entitled RESISTORS OF 3D INTEGRATED CIRCUIT DEVICES AND METHODS OF FORMING THE SAME, filed in the USPTO on Oct. 29, 2021, the disclosure of which is hereby incorporated by reference herein in its entirety.

FIELD

The present disclosure generally relates to the field of electronics and, more particularly, to integrated circuit devices including stacked transistors.

BACKGROUND

Integrated circuit devices may include resistors having various resistance values for different purposes. For example, a DC bias circuit may include a resistor having a high resistance value (e.g., about 10 kiloohms), and a feedback path for reducing an IR drop or a load may include a resistor having a low resistance value (e.g., about 100 ohms or lower). Integrated circuit devices including stacked transistors, such as a complementary field effect transistor (CFET) stack, were introduced to reduce the area of integrated circuit devices, thereby increasing the integration density. Accordingly, resistor structures that can be formed by manufacturing processes compatible with manufacturing processes of stacked transistors and can have various resistance values may be desirable.

SUMMARY

According to some embodiments of the present invention, resistor structures may include a substrate, an upper semiconductor layer that may be spaced apart from the substrate in a vertical direction, a lower semiconductor layer that may be between the substrate and the upper semiconductor layer, and first and second resistor contacts that may be spaced apart from each other in a horizontal direction. At least one of the upper semiconductor layer, the lower semiconductor layer, and a portion of the substrate may contact the first and second resistor contacts. In some embodiments, an integrated circuit device may include the resistor structure and a stacked transistor structure. The stacked transistor structure may include an upper transistor comprising an upper source/drain region and a lower transistor that may be between the substrate and the upper transistor and may include a lower source/drain region. The the upper semiconductor layer and the upper source/drain region may include the same material and may have an equal thickness in the vertical direction, and the lower semiconductor layer and the lower source/drain region may include the same material and may have an equal thickness in the vertical direction.

According to some embodiments of the present invention, resistor structures may include a substrate, an upper semiconductor layer that may be spaced apart from the substrate in a vertical direction, and a lower semiconductor layer that may be between the substrate and the upper semiconductor layer. At least two of the upper semiconductor layer, the lower semiconductor layer, and a portion of the substrate may be configured to function as respective resistors that are connected in parallel.

According to some embodiments of the present invention, methods of forming an integrated circuit device may include forming a resistor structure. Forming the resistor structure may include forming a lower thin semiconductor layer and an upper thin semiconductor layer on a substrate. The lower thin semiconductor layer may be spaced apart from the substrate in a vertical direction and may be between the substrate and the upper thin semiconductor layer. Forming the resistor structure may also include forming a lower semiconductor layer by performing a first epitaxial growth process using the lower thin semiconductor layer as a first seed layer, forming an upper semiconductor layer by performing a second epitaxial growth process using the upper thin semiconductor layer as a second seed layer, and forming first and second resistor contacts that may be spaced apart from each other in a horizontal direction and may contact at least one of the upper semiconductor layer, the lower semiconductor layer, and a portion of the substrate.

DETAILED DESCRIPTION

Resistor structures and methods of forming the same pursuant to embodiments of the present invention can simplify manufacturing processes of an integrated circuit device that includes both resistor structures and stacked transistors, as common manufacturing processes can be used to form elements of the resistor structures and stacked transistors.

Figure 5:
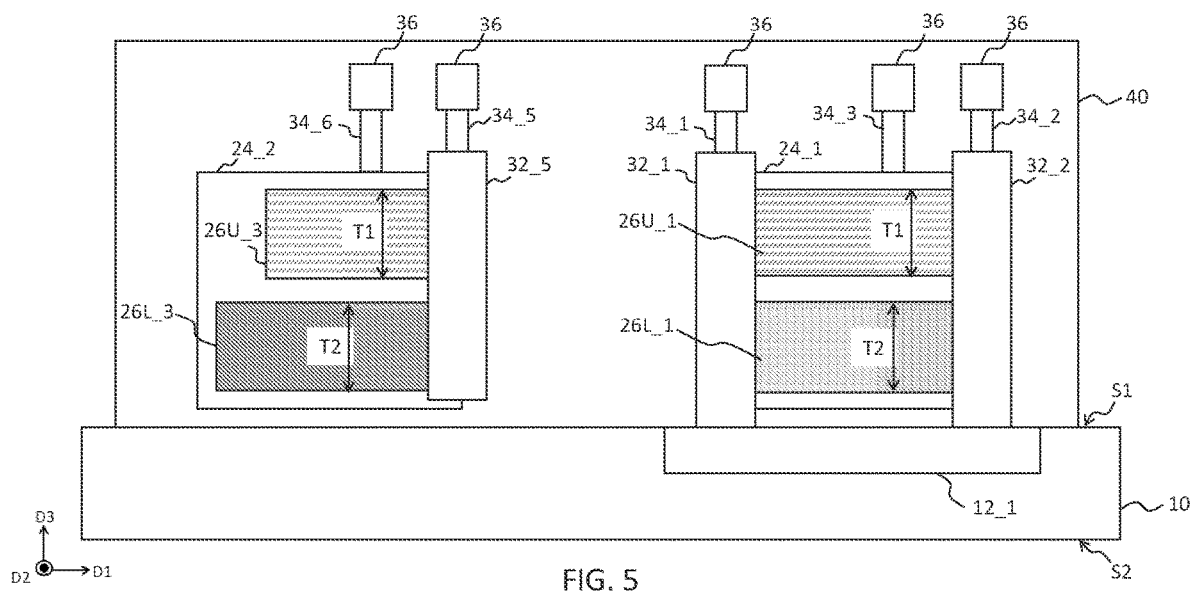
FIGS. 5 and 6 are side views of the integrated circuit device from viewpoints V and W in FIG. 4, respectively, according to some embodiments of the present invention.

Processes of forming stacked transistors may form multiple semiconductor elements (e.g., a first upper semiconductor layer 26U_1, a first lower semiconductor layer 26L_1 and a first portion 12_1 of a substrate 10 in FIG. 5), each of which can be used as a resistor, and may also form conductive contacts (e.g., a first resistor contact 32_1 and a second resistor contact 32_2 in FIG. 5) that are electrically connected to at least one of those three semiconductor elements and thus can be used as resistor contacts. Accordingly, a resistor structure according to some embodiments of the present invention may be formed by processes of forming stacked transistors without additional processes.

According to some embodiments of the present invention, resistor elements may be formed to have different resistance values by adjusting, for example, a material and/or an impurity concentration, and resistor structures having various resistance values may be formed by electrically connecting different sets of those resistor elements.

According to some embodiments of the present invention, a resistor structure may include multiple resistor elements that are electrically connected in parallel and have different respective resistance values, and thus it may be easier to reduce a deviation of a resistance value of the resistor structure from a pre-determined resistance value.

As used herein the term "and/or" includes any and all combinations of one or more of the associated listed items. Further, as used herein, "formed concurrently" refers to being formed by the same fabrication process(es), at approximately (but not necessarily exactly) the same time.

Figure 1:
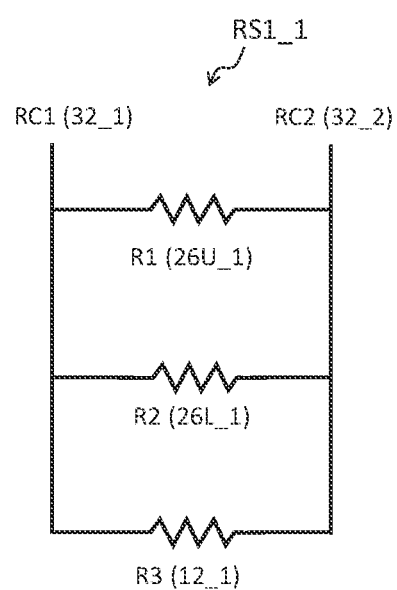
FIGS. 1 to 3 are schematic illustrations of first resistor structures according to some embodiments of the present invention.
Figure 2:
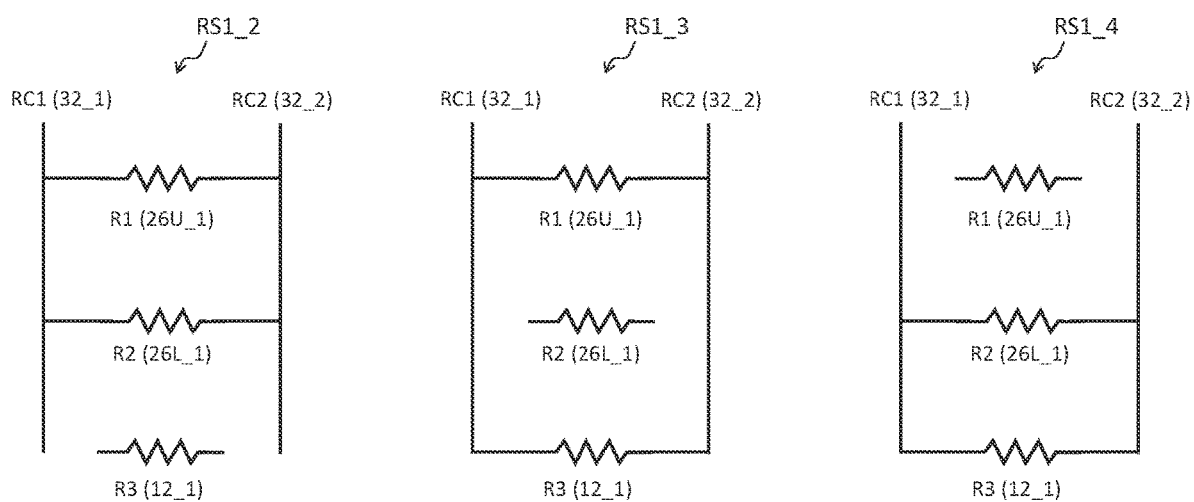
Figure 3:
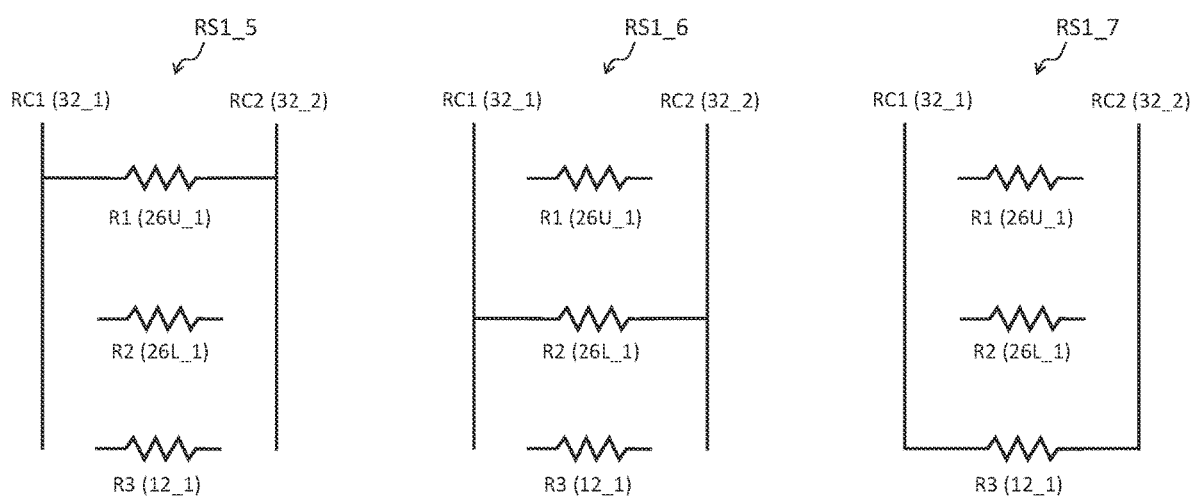

FIGS. 1 to 3 are schematic illustrations of various first resistor structures RS1. Referring to FIG. 1, a first resistor structure RS1_1 may include a first resistor element R1, a second resistor element R2 and a third resistor element R3 that are all electrically connected to a first resistor contact RC1 and a second resistor contact RC2. The first, second and third resistor elements R1, R2, and R3 may be electrically connected to each other in parallel.

For example, the first, second and third resistor elements R1, R2, and R3 may be an upper semiconductor layer (e.g., a first upper semiconductor layer 26U_1 in FIG. 5), a lower semiconductor layer (e.g., a first lower semiconductor layer 26L_1 in FIG. 5) and a portion of a substrate (e.g., a first portion 12_1 of a substrate 10 in FIG. 5), respectively.

Referring to FIG. 2, the first and second resistor contacts RC1 and RC2 of each of the first resistor structures RS1_2, RS1_3 and RS1_4 may be electrically connected to two of the first, second and third resistor elements R1, R2, and R3, and may be electrically isolated from the remaining one of the first, second and third resistor elements R1, R2, and R3.

Referring to FIG. 3, the first and second resistor contacts RC1 and RC2 of each of the first resistor structures RS1_5, RS1_6 and RS1_7 may be electrically connected to one of the first, second and third resistor elements R1, R2, and R3 and may be electrically isolated from the remaining two of the first, second and third resistor elements R1, R2, and R3. The first resistor structures RS1 illustrated in FIGS. 1 to 3 may have various resistance values, as different sets of the first, second and third resistor elements R1, R2, and R3 are electrically connected to each other.

Figure 4:
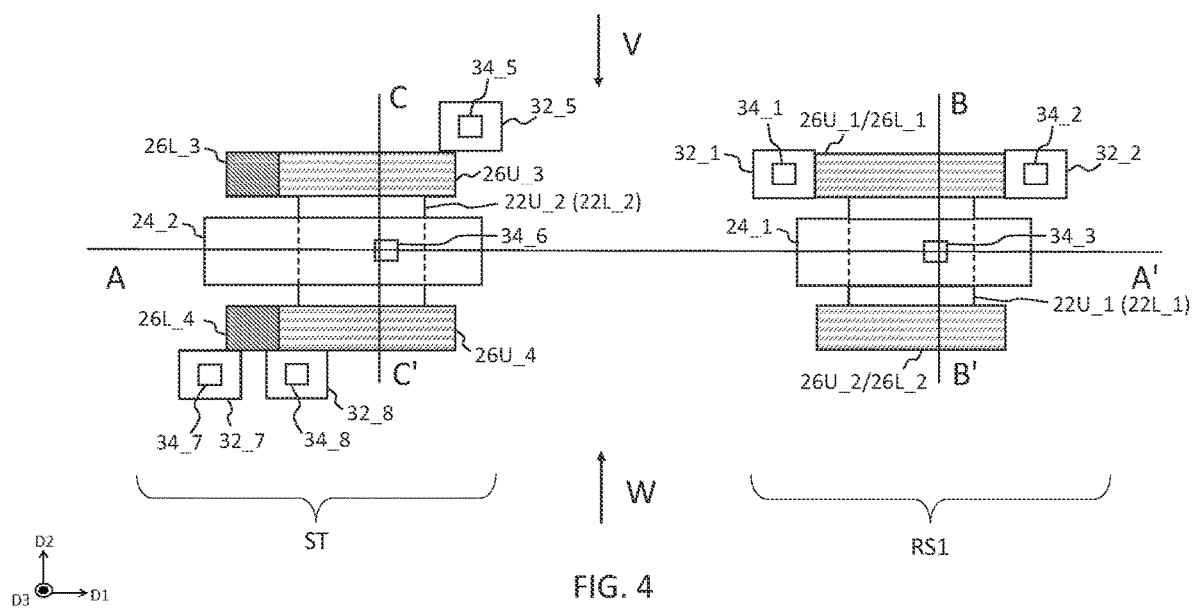
FIG. 4 is a plan view of an integrated circuit device according to some embodiments of the present invention.
Figure 6:
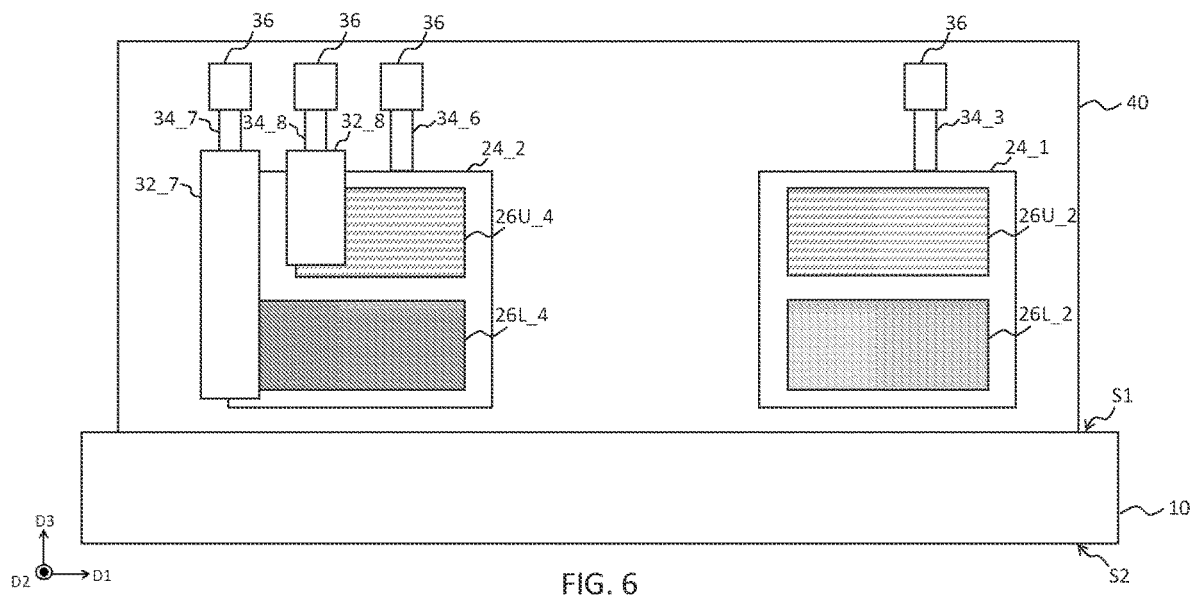
Figure 7:
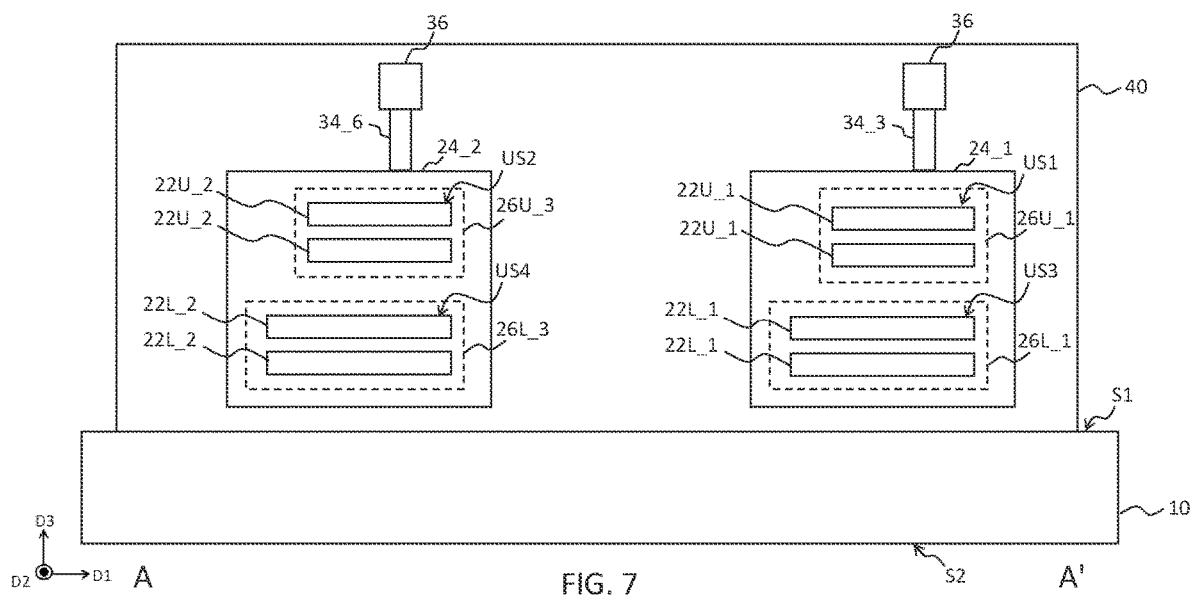
FIGS. 7 and 8 are cross-sectional views of the integrated circuit device taken along the line A-A' and the line B-B' in FIG. 4, respectively, according to some embodiments of the present invention.
Figure 8:
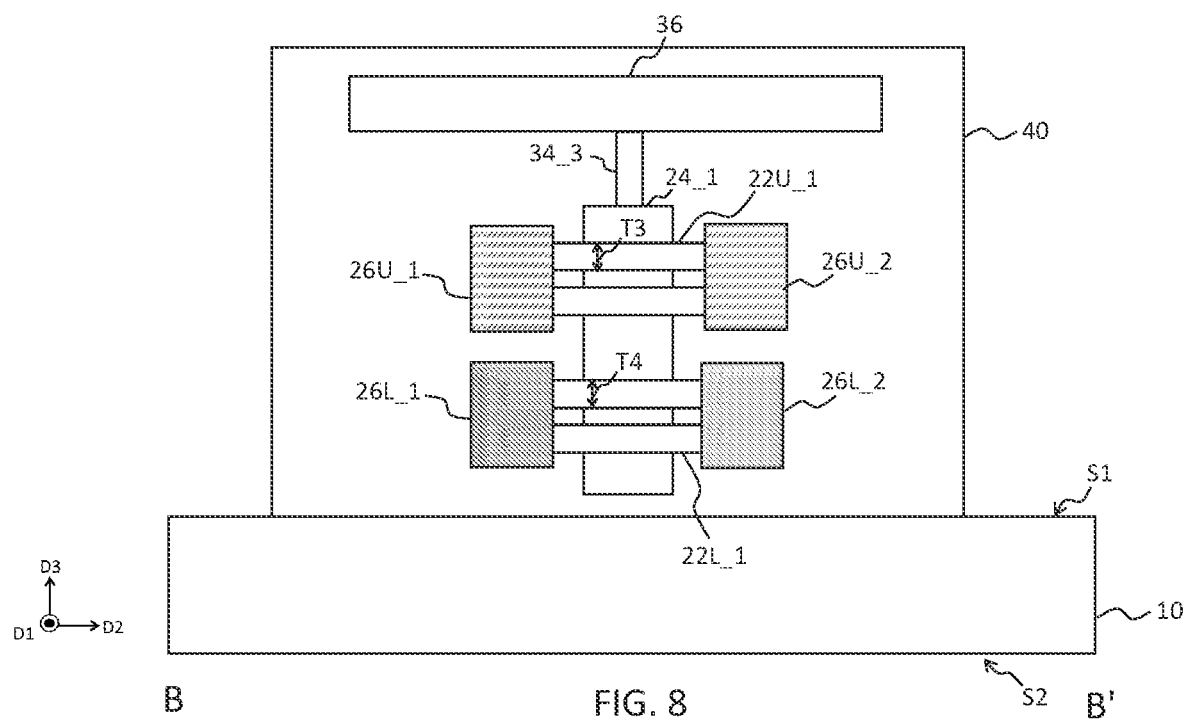

FIG. 4 is a plan view of an integrated circuit device according to some embodiments of the present invention. FIGS. 5 and 6 are side views of the integrated circuit device from viewpoints V and W in FIG. 4, respectively, according to some embodiments of the present invention. Specifically, FIG. 5 shows an example configuration of elements of the first resistor structure RS1_1 in FIG. 1. FIGS. 7 and 8 are cross-sectional views of the integrated circuit device taken along the line A-A' and the line B-B' in FIG. 4, respectively, according to some embodiments of the present invention. For simplicity of illustration, FIG. 4 does not show some elements (e.g., conductive wires 36 and an interlayer insulating layer 42) in FIGS. 5-8.

Referring to FIGS. 4 through 8, the integrated circuit device may include a stacked transistor structure ST on a substrate 10 and a first resistor structure RS1. The substrate 10 may include a first surface S1 and a second surface S2. The first surface S1 and the second surface S2 may be opposite and parallel to each other. The first surface S1 may be a front side of the substrate 10, and the second surface S2 may be a backside of the substrate 10.

FIG. 4 illustrates that the stacked transistor structure ST is spaced apart from the first resistor structure RS1 in a first direction D1, but the present invention is not limited thereto. In some embodiments, the stacked transistor structure ST may be spaced apart from the first resistor structure RS1 in any direction. The first direction D1 may be parallel to the first surface S1 and the second surface S2 of the substrate 10 and may be a first horizontal direction.

The first resistor structure RS1 may include a first upper semiconductor layer 26U_1 and a second upper semiconductor layer 26U_2 that may be spaced apart from the first upper semiconductor layer 26U_1 in a second direction D2. The second direction D2 may be parallel to the first surface S1 and the second surface S2 of the substrate 10 and may be a second horizontal direction. The second direction D2 may be different from the first direction D1, and in some embodiments, the second direction D2 may be perpendicular to the first direction D1. The first upper semiconductor layer 26U_1 and the second upper semiconductor layer 26U_2 may have a first conductivity type (e.g., an N-type conductivity or a P-type conductivity).

Each of the first upper semiconductor layer 26U_1 and the second upper semiconductor layer 26U_2 may have a first thickness T1 in a third direction D3. The third direction D3 may be perpendicular to the first and second directions D1 and D2 and may be a vertical direction.

A first upper thin semiconductor layer 22U_1 may be provided between the first upper semiconductor layer 26U_1 and the second upper semiconductor layer 26U_2 and may contact both the first upper semiconductor layer 26U_1 and the second upper semiconductor layer 26U_2. In some embodiments, the first upper thin semiconductor layer 22U_1 may contact side surfaces of the first upper semiconductor layer 26U_1 and the second upper semiconductor layer 26U_2 as illustrated in FIG. 8. The first upper thin semiconductor layer 22U_1 may have a conductivity type that is different from the conductivity type of the first upper semiconductor layer 26U_1 and the second upper semiconductor layer 26U_2. In some embodiments, the first upper thin semiconductor layer 22U_1 may include a material different from the first upper semiconductor layer 26U_1 and the second upper semiconductor layer 26U_2. For example, the first upper thin semiconductor layer 22U_1 may include a silicon layer, and each of the first upper semiconductor layer 26U_1 and the second upper semiconductor layer 26U_2 may include a silicon germanium layer.

The first upper thin semiconductor layer 22U_1 may have a third thickness T3 in the third direction D3, and the third thickness T3 may be thinner than the first thickness T1. For example, the third thickness T3 may be in a range of from 1 nm to 100 nm, and the first thickness T1 may be at least 1.5 times the third thickness T3.

The first resistor structure RS1 may also include a first lower semiconductor layer 26L_1 and a second lower semiconductor layer 26L_2 that may be spaced apart from the first lower semiconductor layer 26L_1 in the second direction D2. A first lower thin semiconductor layer 22L_1 may be provided between the first lower semiconductor layer 26L_1 and the second lower semiconductor layer 26L_2 and may contact both the first lower semiconductor layer 26L_1 and the second lower semiconductor layer 26L_2. In some embodiments, the first lower thin semiconductor layer 22L_1 may contact side surfaces of the first lower semiconductor layer 26L_1 and the second lower semiconductor layer 26L_2 as illustrated in FIG. 8.

The first lower semiconductor layer 26L_1 and the second lower semiconductor layer 26L_2 may have a second conductivity type that is different from the first conductivity type. The first lower thin semiconductor layer 22L_1 may have a conductivity type that is different from the conductivity type of the first lower semiconductor layer 26L_1 and the second lower semiconductor layer 26L_2. In some embodiments, the first lower thin semiconductor layer 22L_1 may include a material different from the first lower semiconductor layer 26L_1 and the second lower semiconductor layer 26L_2. For example, the first lower thin semiconductor layer 22L_1 may include a silicon layer, and each of the first lower semiconductor layer 26L_1 and the second lower semiconductor layer 26L_2 may include a silicon germanium layer.

Each of the first lower semiconductor layer 26L_1 and the second lower semiconductor layer 26L_2 may have a second thickness T2 in the third direction D3. The first lower thin semiconductor layer 22L_1 may have a fourth thickness T4 in the third direction D3, and the fourth thickness T4 may be thinner than the second thickness T2. For example, the fourth thickness T4 may be in a range of, for example, from 1 nm to 100 nm, and the second thickness T2 may be at least 1.5 times the fourth thickness T4.

Further, the first resistor structure RS1 may include a first portion 12_1 of the substrate 10. The first portion 12_1 of the substrate 10 may include impurities (e.g., boron, aluminum, gallium, indium, phosphorus or arsenic) and may have the first conductivity type or the second conductivity type. The first portion 12_1 of the substrate 10 may have an impurity concentration in a range of from $10^{11}$ cm$^{-3}$ to $10^{15}$ cm$^{-3}$ (e.g., from $10^{12}$ cm$^{-3}$ to $10^{14}$ cm$^{-3}$).

The first resistor structure RS1 may additionally include a first contact 32_1 (also referred to as a first resistor contact) and a second contact 32_2 (also referred to as a second resistor contact). The first contact 32_1 and the second contact 32_2 may be spaced apart from each other in the first direction D1. Each of the first contact 32_1 and the second contact 32_2 may contact the first upper semiconductor layer 26U_1, the first lower semiconductor layer 26L_1 and the first portion 12_1 of the substrate 10, and thus the first upper semiconductor layer 26U_1, the first lower semiconductor layer 26L_1 and the first portion 12_1 of the substrate 10 may be electrically connected in parallel.

Although FIG. 4 illustrates that the first contact 32_1 and the second contact 32_2 respectively contact opposing ends of the first upper semiconductor layer 26U_1 and the first lower semiconductor layer 26L_1, the present invention is not limited thereto. In some embodiments, at least one of the first contact 32_1 and the second contact 32_2 may contact a side surface of the the first upper semiconductor layer 26U_1, which extends in the first direction D1, or a side surface of the first lower semiconductor layer 26L_1, which extends in the first direction D1.

In some embodiments, a first metal layer 24_1 may be provided between the first lower semiconductor layer 26L_1 and the second lower semiconductor layer 26L_2 and between the first upper semiconductor layer 26U_1 and the second upper semiconductor layer 26U_2. The first metal layer 24_1 may be spaced apart from the first lower semiconductor layer 26L_1, the second lower semiconductor layer 26L_2, the first upper semiconductor layer 26U_1 and the second upper semiconductor layer 26U_2 in the second direction D2 as illustrated in FIGS. 4 and 8. A portion of the first lower thin semiconductor layer 22L_1 and a portion of the first upper thin semiconductor layer 22U_1 may be in the first metal layer 24_1 as illustrated in FIGS. 4, 7 and 8.

Still referring to FIGS. 4 through 8, the stacked transistor structure ST may include a third lower semiconductor layer 26L_3 and a fourth lower semiconductor layer 26L_4 that may be spaced apart from the third lower semiconductor layer 26L_3 in the second direction D2. A second lower thin semiconductor layer 22L_2 may be provided between the third lower semiconductor layer 26L_3 and the fourth lower semiconductor layer 26L_4 and may contact both the third lower semiconductor layer 26L_3 and the fourth lower semiconductor layer 26L_4. In some embodiments, the second lower thin semiconductor layer 22L_2 may contact side surfaces of the third lower semiconductor layer 26L_3 and the fourth lower semiconductor layer 26L_4. The third lower semiconductor layer 26L_3 and the fourth lower semiconductor layer 26L_4 may have the second conductivity type. The second lower thin semiconductor layer 22L_2 may be a lower active layer of a lower transistor, and the third lower semiconductor layer 26L_3 and the fourth lower semiconductor layer 26L_4 may be lower source/drain regions of the lower transistor.

Each of the third lower semiconductor layer 26L_3 and the fourth lower semiconductor layer 26L_4 may have the second thickness T2 in the third direction D3. The second lower thin semiconductor layer 22L_2 may have the fourth thickness T4 in the third direction D3.

The stacked transistor structure ST may also include a third upper semiconductor layer 26U_3 and a fourth upper semiconductor layer 26U_4 that may be spaced apart from the third upper semiconductor layer 26U_3 in the second direction D2. A second upper thin semiconductor layer 22U_2 may be provided between the third upper semiconductor layer 26U_3 and the fourth upper semiconductor layer 26U_4 and may contact both the third upper semiconductor layer 26U_3 and the fourth upper semiconductor layer 26U_4. In some embodiments, the second upper thin semiconductor layer 22U_2 may contact side surfaces of the third upper semiconductor layer 26U_3 and the fourth upper semiconductor layer 26U_4. The third upper semiconductor layer 26U_3 and the fourth upper semiconductor layer 26U_4 may have the first conductivity type. The second upper thin semiconductor layer 22U_2 may be an upper active layer of an upper transistor, and the third upper semiconductor layer 26U_3 and the fourth upper semiconductor layer 26U_4 may be upper source/drain regions of the upper transistor.

Each of the third upper semiconductor layer 26U_3 and the fourth upper semiconductor layer 26U_4 may have the first thickness T1 in the third direction D3. The second upper thin semiconductor layer 22U_2 may have the third thickness T3 in the third direction D3.

In some embodiments, a lower surface of the first upper semiconductor layer 26U_1 and a lower surface of the third upper semiconductor layer 26U_3 may be coplanar with each other, and a lower surface of the first lower semiconductor layer 26L_1 and a lower surface of the third lower semiconductor layer 26L_3 may be coplanar with each other as illustrated in FIG. 5. As used herein, "a lower surface of an element A" (or similar language) means a surface of the element A facing the substrate 10.

The stacked transistor structure ST may further include a fifth contact 32_5, a sixth contact 32_6, a seventh contact 32_7, an eighth contact 32_8 and a second metal layer 24_2. The fifth contact 32_5 may contact the third lower semiconductor layer 26L_3 and the third upper semiconductor layer 26U_3, and the sixth contact 32_6 may contact the second metal layer 24_2. The seventh contact 32_7 and the eight contact 32_8 may contact the fourth lower semiconductor layer 26L_4 and the fourth upper semiconductor layer 26U_4, respectively. In some embodiments, the first, second, fifth, seventh and eight contacts 32_1, 32_2, 32_5, 32_7 and 32_8 may have upper surfaces coplanar with each other and may be at an equal height from the first surface S1 of the substrate 10.

The second metal layer 24_2 may be provided between the third lower semiconductor layer 26L_3 and the fourth lower semiconductor layer 26L_4 and between the third upper semiconductor layer 26U_3 and the fourth upper semiconductor layer 26U_4. The second metal layer 24_2 may be spaced apart from the third lower semiconductor layer 26L_3, the fourth lower semiconductor layer 26L_4, the third upper semiconductor layer 26U_3 and the fourth upper semiconductor layer 26U_4 in the second direction D2 as illustrated in FIG. 4. A portion of the second lower thin semiconductor layer 22L_2 and a portion of the second upper thin semiconductor layer 22U_2 may be in the second metal layer 24_2 as illustrated in FIG. 7. The second metal layer 24_2 may be a layer of a gate electrode. Although not shown, an insulating layer (i.e., a gate insulating layer) may be provided between the portion of the second lower thin semiconductor layer 22L_2 and the second metal layer 24_2 and between the portion of the second upper thin semiconductor layer 22U_2 and the second metal layer 24_2.

In some embodiments, a first upper surface US1 of the first upper thin semiconductor layer 22U_1 may be coplanar with a second upper surface US2 of the second upper thin semiconductor layer 22U_2 as illustrated in FIG. 7, and the first upper thin semiconductor layer 22U_1 and the second upper thin semiconductor layer 22U_2 may have an equal thickness in the third direction D3. In some embodiments, a third upper surface US3 of the first lower thin semiconductor layer 22L_1 may be coplanar with a fourth upper surface US4 of the second lower thin semiconductor layer 22L_2 as illustrated in FIG. 7, and the first lower thin semiconductor layer 22L_1 and the second lower thin semiconductor layer 22L_2 may have an equal thickness in the third direction D3.

In FIG. 7, the first upper semiconductor layer 26U_1, the first lower semiconductor layer 26L_1, the third upper semiconductor layer 26U_3, the third lower semiconductor layer 26L_3 are represented by dotted boxes to show spatial relationships of those elements with other elements. In some embodiments, each of the first upper semiconductor layer 26U_1, the first lower semiconductor layer 26L_1, the third upper semiconductor layer 26U_3, and the third lower semiconductor layer 26L_3 may overlap the entirety of a corresponding thin semiconductor layer in the second direction D2 as illustrated in FIG. 7. For example, the first upper semiconductor layer 26U_1 may overlap the entirety of the first upper thin semiconductor layer 22U_1. As used herein, "an element A overlapping an element B in a direction X" (or similar language) means that there is at least one line that extends in the direction X and intersects both the elements A and B.

Although each of the first metal layer 24_1 and the second metal layer 24_2 is illustrated as a single layer, the present invention is not limited thereto. In some embodiments, each of the first metal layer 24_1 and the second metal layer 24_2 may include multiple conductive layers. For example, the first and second metal layers 24_1 and 24_2 may include a semiconductor layer (e.g., a poly silicon layer), a work function layer (e.g., TiC layer, TiAl layer, TiAlC layer or TiN layer) and/or a metal layer (e.g., a tungsten layer, an aluminum layer or a copper layer).

Further, in some embodiments, a lower portion of each of the first metal layer 24_1 and the second metal layer 24_2 may include material(s) different from an upper portion of each of the first metal layer 24_1 and the second metal layer 24_2. Further, in some embodiments, an isolation layer may be provided between the lower portion and the upper portion of each of the first metal layer 24_1 and the second metal layer 24_2, and the lower portion may be electrically isolated from the upper portion.

The integrated circuit device may further include first to third and fifth to eighth conductive vias 34_1, 34_2, 34_3, 34_5, 34_6, 34_7 and 34_8 that may contact the first contact 32_1, the second contact 32_2, the first metal layer 24_1, the fifth contact 32_5, the second metal layer 24_2, the seventh contact 32_7, and the eighth contact 32_8, respectively. The conductive vias 34_1, 34_2, 34_3, 34_5, 34_6, 34_7 and 34_8 may be electrically connected to conductive wires 36, respectively. In some embodiments, the conductive vias 34_1, 34_2, 34_3, 34_5, 34_6, 34_7 and 34_8 may contact the conductive wires 36, respectively, as illustrated in FIGS. 5 and 6.

An interlayer insulating layer 40 may be provided on the substrate 10. Although the interlayer insulating layer 40 is illustrated as a single layer, the interlayer insulating layer 40 may include multiple layers stacked on the substrate 10. The first resistor structure RS1 and the stacked transistor structure ST may be provided in the interlayer insulating layer 40. The interlayer insulating layer 40 may include an insulating material (e.g., silicon oxide, silicon nitride, silicon oxynitride, silicon carbide and/or low-k material). The low k material may include, for example, fluorine-doped silicon dioxide, organosilicate glass, carbon-doped oxide, porous silicon dioxide, porous organosilicate glass, spin-on organic polymeric dielectric, or spin-on silicon based polymeric dielectric.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

Each of the first lower thin semiconductor layer 22L_1, the first upper thin semiconductor layer 22U_1, the second lower thin semiconductor layer 22L_2 and the second upper thin semiconductor layer 22U_2 may include multiple thin semiconductor layers stacked in the third direction D3. For example, the first upper thin semiconductor layer 22U_1 may include two thin semiconductor layers as illustrated in FIGS. 7 and 8 but the present invention is not limited thereto. Each of the stacked thin semiconductor layers may be, for example, a nanosheet. The nanosheet may include semiconductor material(s) (e.g., silicon, germanium, silicon-germanium, and/or III-V semiconductor compound). For example, each of nanosheets may have a thickness in a range of, for example, from 1 nm to 100 nm in the third direction D3.

Each of the first to fourth lower semiconductor layers 26L_1, 26L_2, 26L_3 and 26L_4 and the first to fourth upper semiconductor layers 26U_1, 26U_2, 26U_3 and 26U_4 may include semiconductor material(s) (e.g., silicon, germanium, silicon-germanium) and may also include impurities (e.g., boron, aluminum, gallium, indium, phosphorus, and/or arsenic). In some embodiments, the first lower semiconductor layer 26L_1 and the first upper semiconductor layer 26U_1 may be a silicon layer (e.g., an amorphous silicon layer).

The first contact 32_1, the second contact 32_2, the fifth contact 32_5, the sixth contact 32_6, the seventh contact 32_7, the eighth contact 32_8, the first to third and fifth to eighth conductive vias 34_1, 34_2, 34_3, 34_5, 34_6, 34_7 and 34_8, and the conductive wires 36 may include a metal layer (e.g., a ruthenium layer, a molybdenum layer, a copper layer, a cobalt layer, an aluminum layer and/or a tungsten layer) and/or a metal nitride layer (e.g., a titanium nitride layer and/or a tantalum nitride layer).

Figure 9:
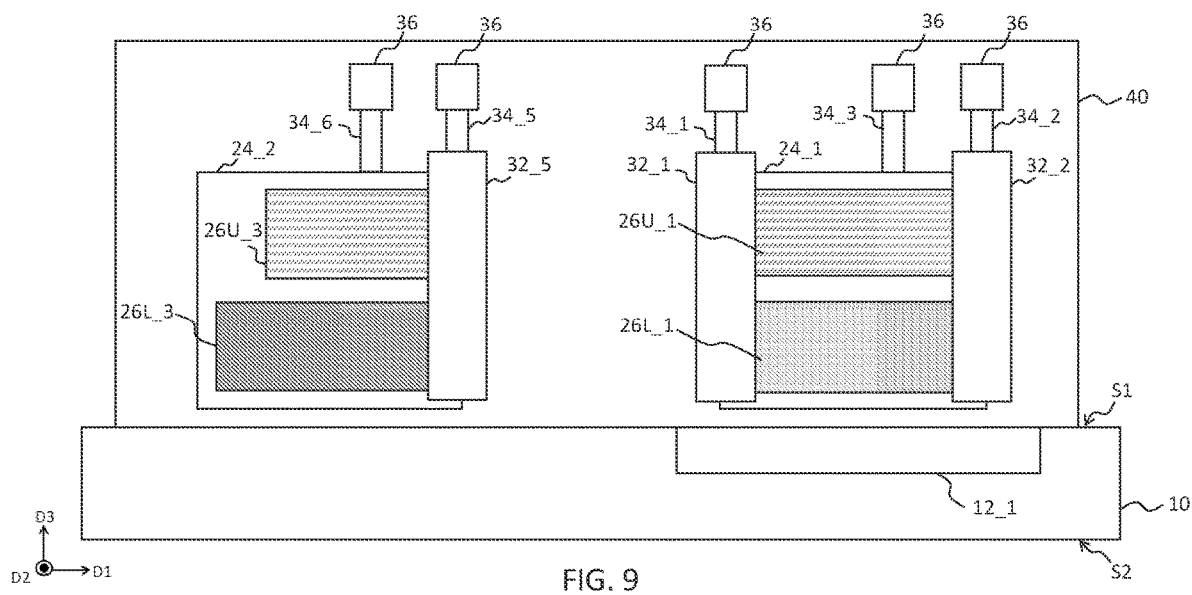
FIGS. 9 through 12 are side views of the integrated circuit device from the viewpoint V in FIG. 4 according to some embodiments of the present invention.

FIGS. 9 through 12 are side views of the integrated circuit device from the viewpoint V in FIG. 4 according to some embodiments of the present invention. FIG. 9 shows an example configuration of elements of the first resistor structure RS1_2 in FIG. 2 according to some embodiments of the present invention. Referring to FIG. 9, the first and second contacts 32_1 and 32_2 may be spaced apart from the substrate 10 in the third direction D3, and thus the first portion 12_1 of the substrate 10 may be electrically isolated from the first and second contacts 32_1 and 32_2.

Figure 10:
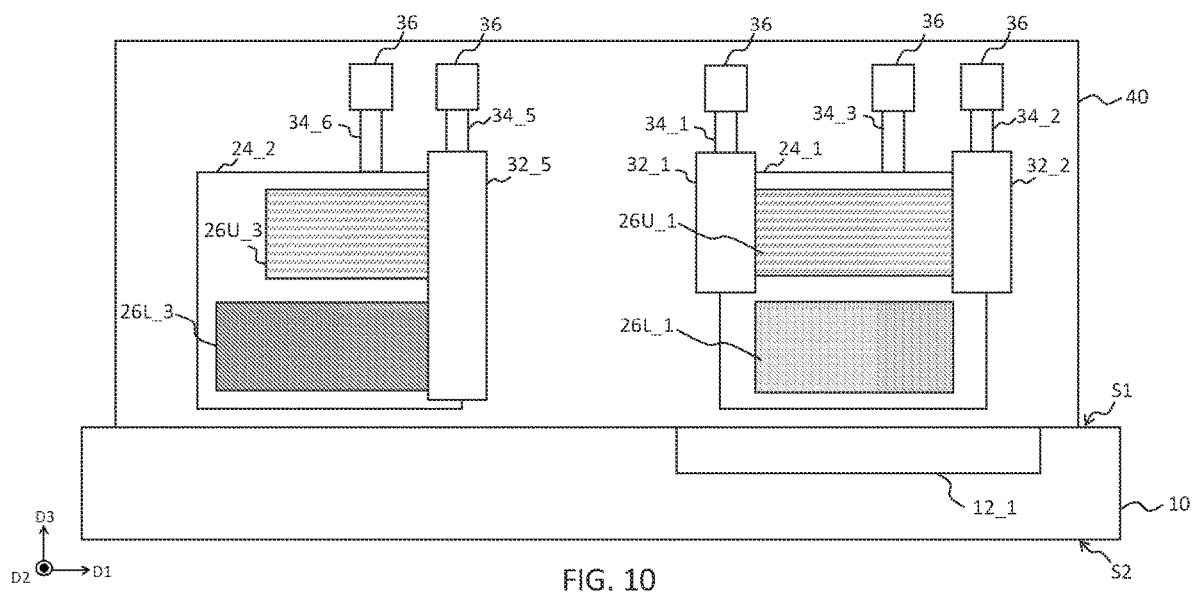

FIG. 10 shows an example configuration of elements of the first resistor structure RS1_5 in FIG. 3 according to some embodiments of the present invention. Referring to FIG. 10, lower surfaces of the first and second contacts 32_1 and 32_2 may be above an upper surface of the first lower semiconductor layer 26L_1 such that the first lower semiconductor layer 26L_1 may be electrically isolated from the first and second contacts 32_1 and 32_2.

Figure 11:
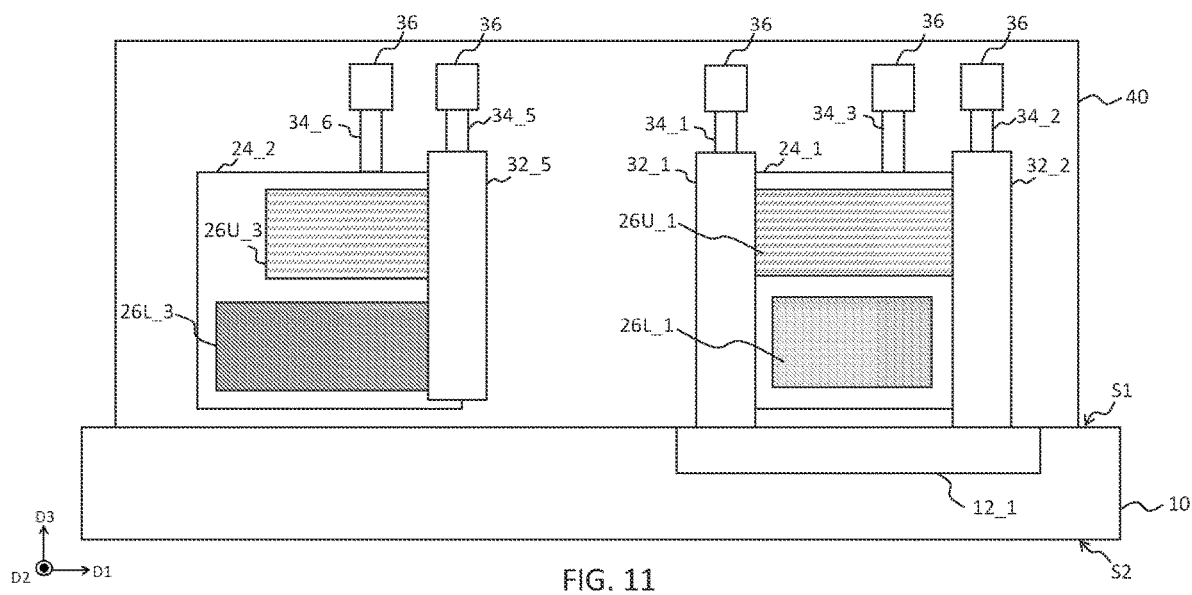
Figure 12:
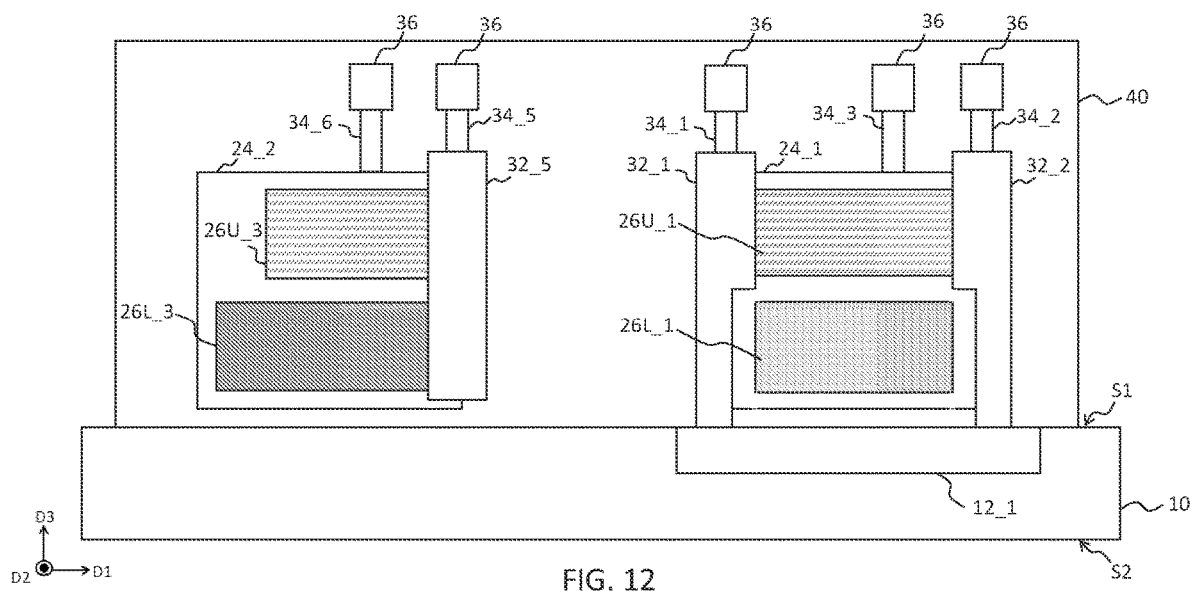

Each of FIGS. 11 and 12 shows an example configuration of elements of the first resistor structure RS1_3 in FIG. 2 according to some embodiments of the present invention. In some embodiments, the lower semiconductor layer 26L_1 may be formed to have a width in the first direction D1 narrower than a width of the upper semiconductor layer 26U_1 in the first direction D1, and opposing sides, in the first direction D1, of the lower semiconductor layer 26L_1 may be spaced apart from the first and second contacts 32_1 and 32_2 as illustrated in FIG. 11. Accordingly, the lower semiconductor layer 26L_1 may be electrically isolated from the first and second contacts 32_1 and 32_2. In some embodiments, one of the opposing sides, in the first direction D1, of the lower semiconductor layer 26L_1 may contact the first contact 32_1 or the second contact 32_2.

Referring to FIG. 12, in some embodiments, the lower semiconductor layer 26L_1 may have a width in the first direction D1 equal to a width of the upper semiconductor layer 26U_1 in the first direction D1, and each of the first and second contacts 32_1 and 32_2 may have a lower portion having a narrower width in the first direction D1 compared to a width of its upper portion. Opposing sides, in the first direction D1, of the lower semiconductor layer 26L_1 may be spaced apart from the first and second contacts 32_1 and 32_2 as illustrated in FIG. 12 and may be electrically isolated from the first and second contact 32_1 and 32_2. In some embodiments, only one of the first and second contacts 32_1 and 32_2 may have the narrower lower portion, and the lower semiconductor layer 26L_1 may contact the first contact 32_1 or the second contact 32_2. In some embodiments, the upper semiconductor layer 26U_1 may not be used as a resistor element, as in the first resistor structure RS1_4 in FIG. 2, and at least one of the first and second contacts 32_1 and 32_2 may have an upper portion having a narrow width in the first direction D1 compared to a width of its lower portion such that the upper semiconductor layer 26U_1 is spaced apart from the at least one of the first and second contacts 32_1 and 32_2.

Figure 13:
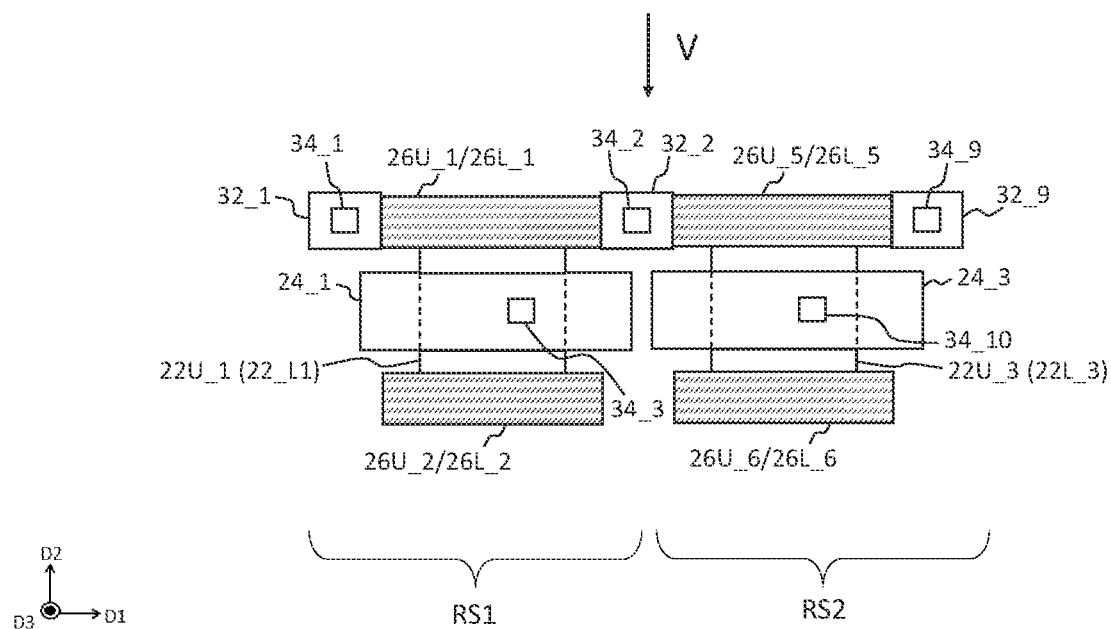
FIG. 13 is a plan view of a resistor structure according to some embodiments of the present invention.

FIG. 13 is a plan view of a resistor structure according to some embodiments of the present invention. The resistor structure may include two resistor structures (i.e., a first resistor structure RS1 and a second resistor structure RS2) that may be connected in series and may share a common resistor contact (e.g., a second contact 32_2). Each of the first and second resistor structures RS1 and RS2 may have any configuration and structure described with reference to FIGS. 1 to 12. For example, the first resistor structure RS1 may be the first resistor structure RS1_7 in FIG. 3, and the second resistor structure RS2 may be the first resistor structure RS1_2 in FIG. 2.

Figure 14:
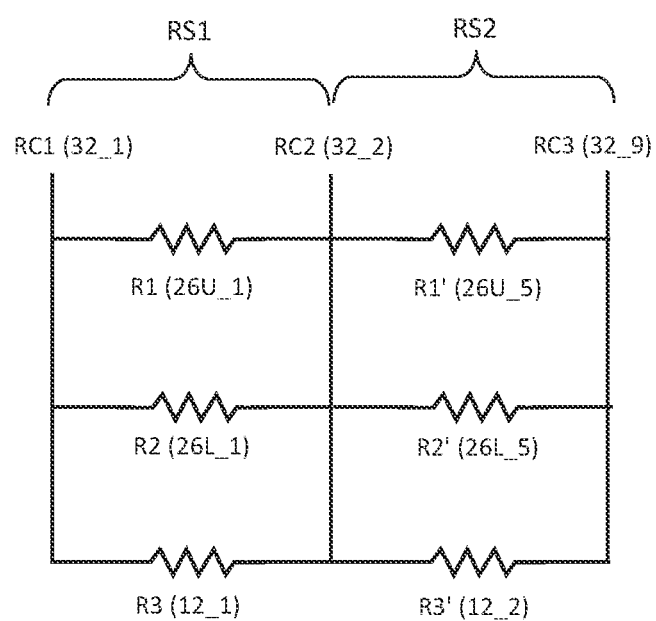
FIG. 14 is a schematic illustration of the resistor structure in FIG. 13 according to some embodiments of the present invention.
Figure 15:
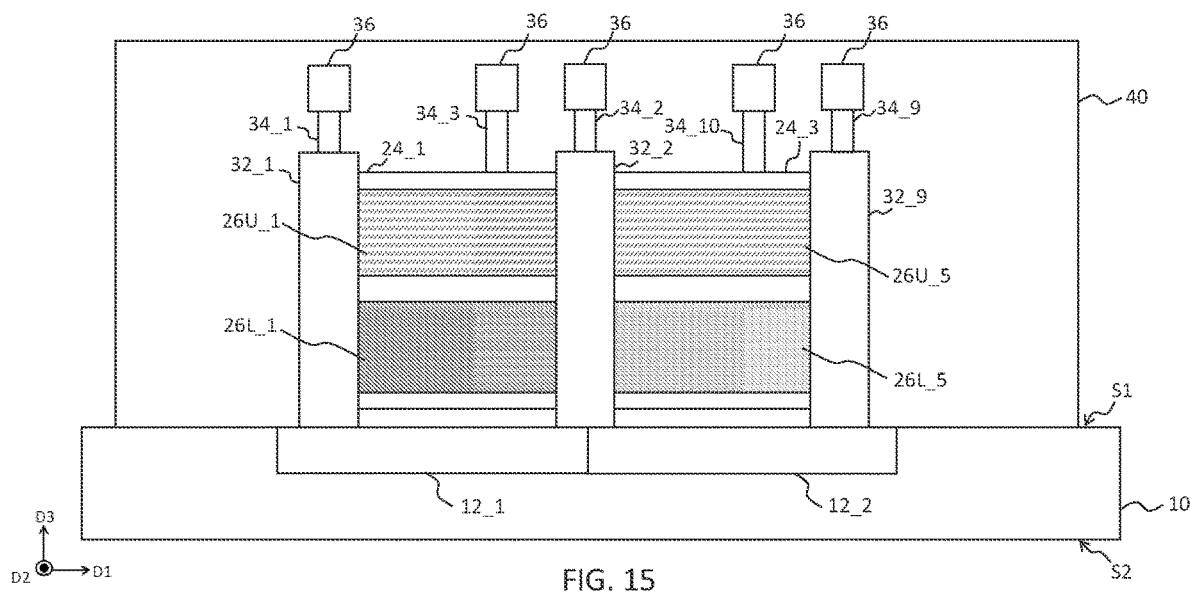
FIG. 15 is a side view of the resistor structure from a viewpoint V in FIG. 13 according to some embodiments of the present invention.

FIG. 14 is a schematic illustration of a resistor structure in FIG. 13, and FIG. 15 is a side view of the resistor structure from a viewpoint V in FIG. 13 when each of the first and second resistor structures RS1 and RS2 has a configuration and structure of the first resistor structure RS1_1 in FIG. 1 according to some embodiments of the present invention. The second resistor structure RS2 may also include a first resistor element R1' (e.g., a fifth upper semiconductor layer 26U_5 in FIG. 15), a second resistor element R2' (e.g., a fifth lower semiconductor layer 26L_5 in FIG. 15) and a third resistor element R3' (e.g., a second portion 12_2 of the substrate 10 in FIG. 15), which are connected in parallel, as illustrated in FIG. 14. The second resistor structure RS2 may have any configuration and structure described with reference to FIGS. 1 to 12.

In some embodiments, a resistor element (e.g., the first resistor element R1) of the first resistor structure RS1 and a resistor element (e.g., the first resistor element R1') of the second resistor structure RS2 may be electrically connected in series through the second contact 32_2.

Referring to FIGS. 13 to 15, the second resistor structure RS2 may include a fifth upper semiconductor layer 26U_5, a sixth upper semiconductor layer 26U_6, a fifth lower semiconductor layer 26L_5, a sixth lower semiconductor layer 26L_6, which may include a material and/or may have a shape and spatial relationship with other elements the same as or similar to the first upper semiconductor layer 26U_1, the second upper semiconductor layer 26U_2, the first lower semiconductor layer 26L_1, the second lower semiconductor layer 26L_2, respectively. The fifth upper semiconductor layer 26U_5 and the sixth upper semiconductor layer 26U_6 may have the first conductivity type, and the fifth lower semiconductor layer 26L_5 and the sixth lower semiconductor layer 26L_6 may have the second conductivity type.

The second resistor structure RS2 may also include a second portion 12_2 of the substrate 10. The second portion 12_2 of the substrate 10 may include impurities (e.g., boron, aluminum, gallium, indium, phosphorus, and/or arsenic) and may have the first conductivity type or the second conductivity type. The second portion 12_2 of the substrate 10 may have an impurity concentration in a range of from $10^{11}$ cm$^{-3}$ to $10^{15}$ cm$^{-3}$ (e.g., from $10^{12}$ cm$^{-3}$ to $10^{14}$ cm$^{-3}$).

A third upper thin semiconductor layer 22U_3 may be provided between the fifth upper semiconductor layer 26U_5 and the sixth upper semiconductor layer 26U_6 and may contact both the fifth upper semiconductor layer 26U_5 and the sixth upper semiconductor layer 26U_6. A third lower thin semiconductor layer 22L_3 may be provided between the fifth lower semiconductor layer 26L_5 and the sixth lower semiconductor layer 26L_6 and may contact both the fifth lower semiconductor layer 26L_5 and the sixth lower semiconductor layer 26L_6. The third upper thin semiconductor layer 22U_3 and the third lower thin semiconductor layer 22L_3 may include a material and/or may have a shape and spatial relationship with other elements the same as or similar to the first upper thin semiconductor layer 22U_1 and the first lower thin semiconductor layer 22L_1, respectively.

The second resistor structure RS2 may also include a ninth contact 32_9 (also referred to as a third resistor contact). In some embodiments, the ninth contact 32_9 may contact the fifth upper semiconductor layer 26U_5, the fifth lower semiconductor layer 26L_5, and the second portion 12_2 of the substrate 10 as illustrated in FIG. 15. Additionally, the second resistor structure RS2 may include a third metal layer 24_3, conductive vias 34_9 and 34_10, and conductive wires 36 as illustrated in FIGS. 13 and 15.

Figure 16:
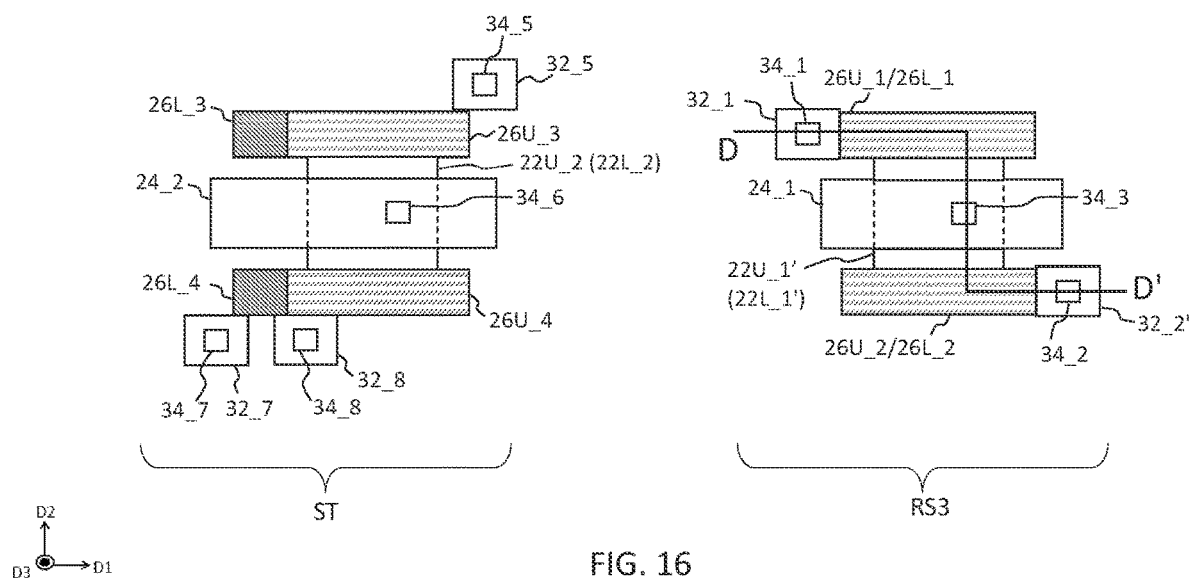
FIG. 16 is a plan view of an integrated circuit device according to some embodiments of the present invention.
Figure 17:
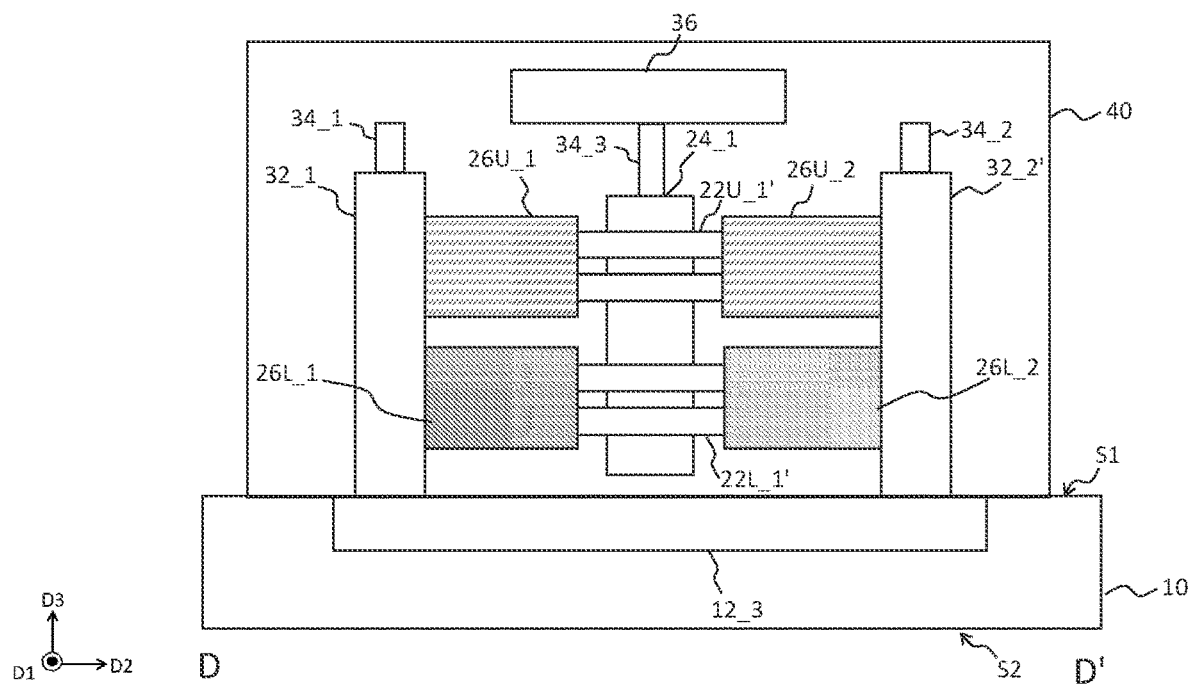
FIGS. 17 to 19 are cross-sectional views of the integrated circuit device taken along the line D-D' in FIG. 16 according to some embodiments of the present invention.
Figure 18:
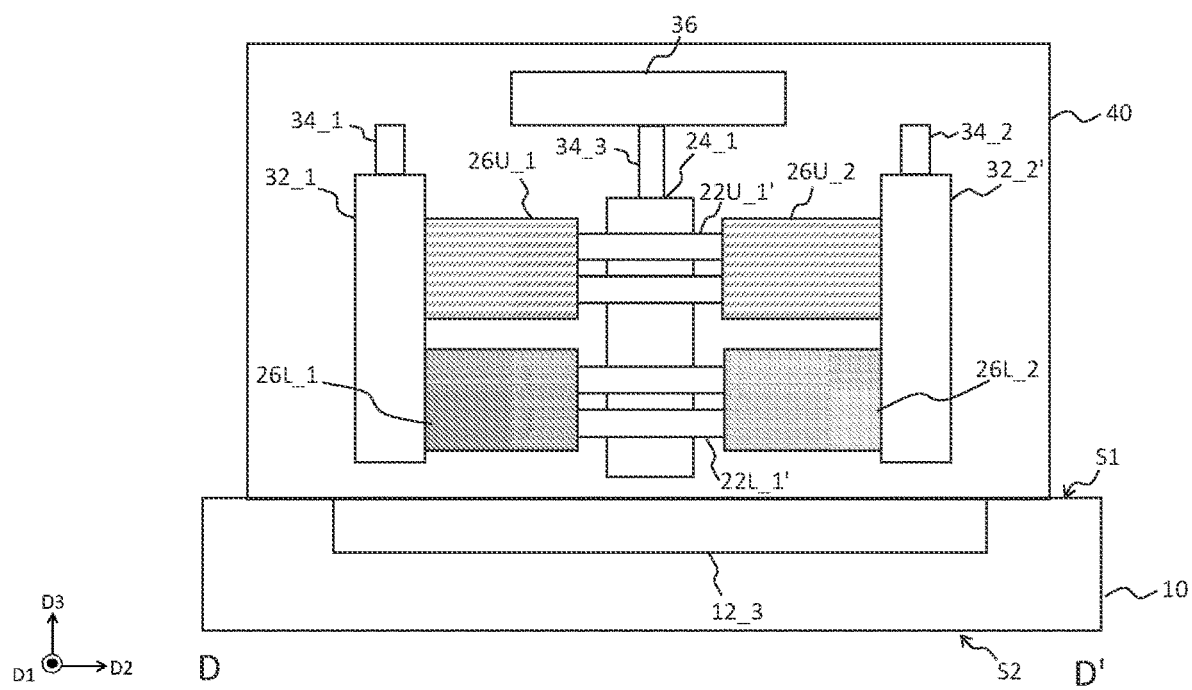
Figure 19:
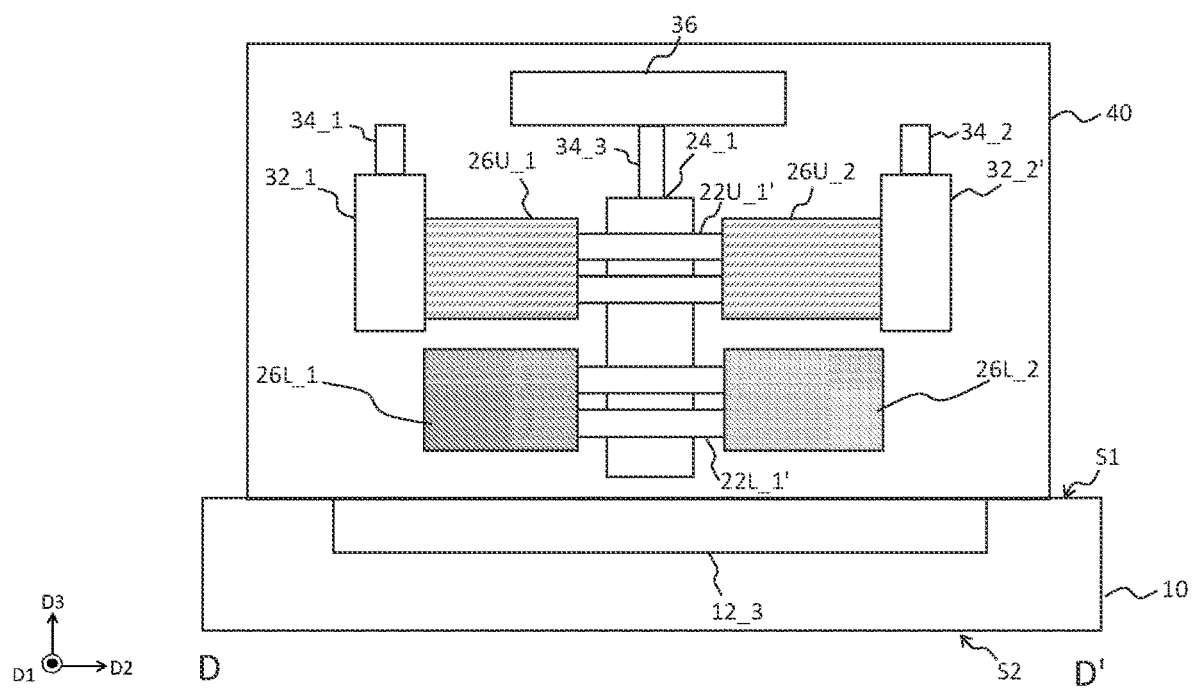

FIG. 16 is a plan view of an integrated circuit device according to some embodiments of the present invention, and FIGS. 17 to 19 are cross-sectional views of the integrated circuit device taken along the line D-D' in FIG. 16 according to some embodiments of the present invention. The integrated circuit devices illustrated in FIGS. 16-19 are the same as or similar to the integrated circuit devices illustrated in FIGS. 4-8 with primary differences being that a first contact 32_1 and a second contact 32_2' of a third resistor structure RS3 are on opposing sides of the first metal layer 24_1, respectively, and the first upper thin semiconductor layer 22U_1' and the first lower thin semiconductor layer 22L_1' of the third resistor structure RS3 include impurities for electrical connection between the first contact 32_1 and the second contact 32_2' through the first upper thin semiconductor layer 22U_1' and the first lower thin semiconductor layer 22L_1'.

The third resistor structure RS3 may also include three resistor elements, a first resistor element R1, a second resistor element R2, and a third resistor element R3, which can be connected in various ways as illustrated in FIGS. 1 and 3. The first resistor element R1 of the third resistor structure RS3 may include a first upper semiconductor layer 26U_1, a second upper semiconductor layer 26U_2 and a first upper thin semiconductor layer 22U_1' that contacts the first upper semiconductor layer 26U_1 and the second upper semiconductor layer 26U_2. The first upper thin semiconductor layer 22U_1' may include impurities (e.g., boron, aluminum, gallium, indium, phosphorus, and/or arsenic) to have the same conductivity type as the first upper semiconductor layer 26U_1 and the second upper semiconductor layer 26U_2.

The second resistor element R2 of the third resistor structure RS3 may include a first lower semiconductor layer 26L_1, a second lower semiconductor layer 26L_2 and a first lower thin semiconductor layer 22L_1' that contacts the first lower semiconductor layer 26L_1 and the second lower semiconductor layer 26L_2. The first lower thin semiconductor layer 22L_1' may include impurities (e.g., boron, aluminum, gallium, indium, phosphorus, and/or arsenic) to have the same conductivity type as the first lower semiconductor layer 26L_1 and the second lower semiconductor layer 26L_2.

For example, each of the first upper thin semiconductor layer 22U_1' and the first lower thin semiconductor layer 22L_1' may be a silicon layer or a silicon germanium layer and may have an impurity concentration in a range of from $10^{15}$ cm$^{-3}$ to $10^{20}$ cm$^{-3}$ (e.g., about from $10^{16}$ cm$^{-3}$ to $10^{19}$ cm$^{-3}$ or about from $10^{17}$ cm$^{-3}$ to $10^{18}$ cm$^{-3}$).

The third resistor element R3 of the third resistor structure RS3 may include a third portion 12_3 of the substrate 10. The third portion 12_3 of the substrate 10 may include impurities (e.g., boron, aluminum, gallium, indium, phosphorus, and/or arsenic) and may have the first conductivity type or the second conductivity type. The third portion 12_3 of the substrate 10 may have an impurity concentration in a range of from $10^{11}$ cm$^{-3}$ to $10^{15}$ cm$^{-3}$ (e.g., from $10^{12}$ cm$^{-3}$ to $10^{14}$ cm$^{-3}$).

The first, second and third resistor elements R1, R2 and R3 of the third resistor structure RS3 may be connected to the first contact 32_1 and the second contact 32_2' in various ways as illustrated in FIGS. 1 and 3 to make the third resistor structure RS3 have a pre-determined resistance value.

As examples, FIGS. 17 to 19 show cross-sectional views of the third resistor structures RS3 that have electrical connections the same as the first resistor structures RS1_1 in FIG. 1, RS1_2 in FIG. 2 and RS1_5 in FIG. 3, respectively.

In some embodiments, the first, second and third resistor elements R1, R2 and R3 of the third resistor structure RS3 all may contact the first contact 32_1 and the second contact 32_2' and may be electrically connected in parallel as illustrated in FIG. 17. In some embodiments, only two resistor elements (e.g., the first and second resistor elements R1, R2, the first and third resistor elements R1, R3 or the second and third resistor elements R2, R3) among the three resistor elements R1, R2 and R3 may contact the first contact 32_1 and the second contact 32_2' and may be electrically connected in parallel. For example, the first and second resistor elements R1, R2 may contact the first contact 32_1 and the second contact 32_2', and the third resistor element R3 may not contact the first contact 32_1 and the second contact 32_2' as illustrated in FIG. 18. In some embodiments, only single resistor element (e.g., the first resistor element R1, the second resistor element R2, or the third resistor element R3) among the three resistor elements R1, R2 and R3 may contact and may be electrically connected to the first contact 32_1 and the second contact 32_2'. For example, the first resistor element R1 may contact the first contact 32_1 and the second contact 32_2', and the second and third resistor elements R2, R3 may not contact the first contact 32_1 and the second contact 32_2' as illustrated in FIG. 19.

Figure 20:
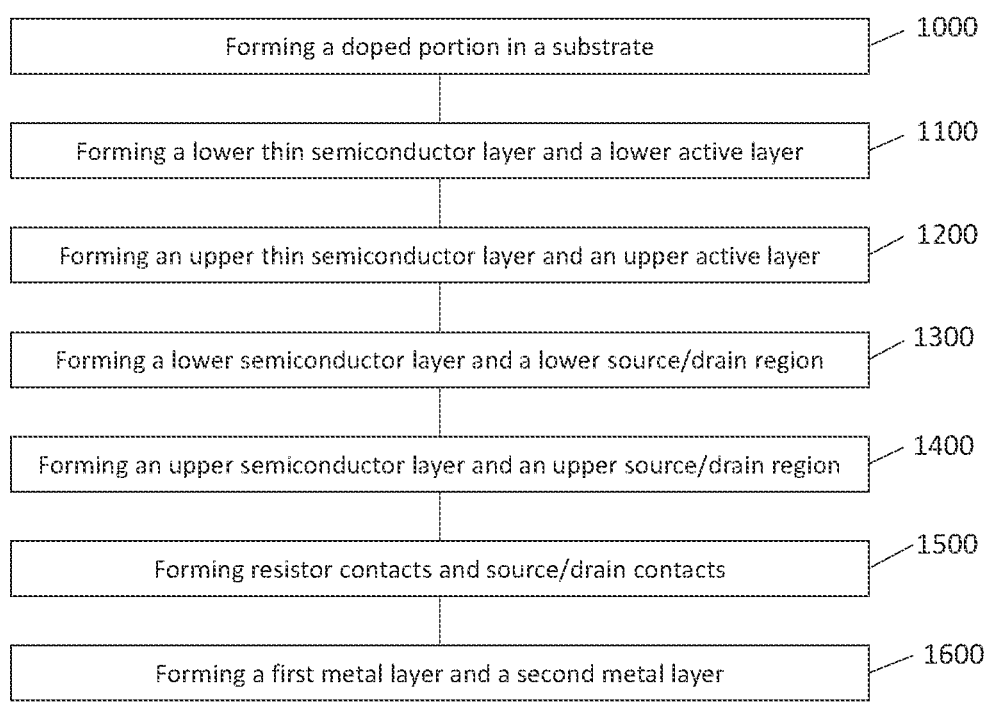
FIG. 20 is a flow chart of methods of forming an integrated circuit device according to some embodiments of the present invention.
Figure 21:
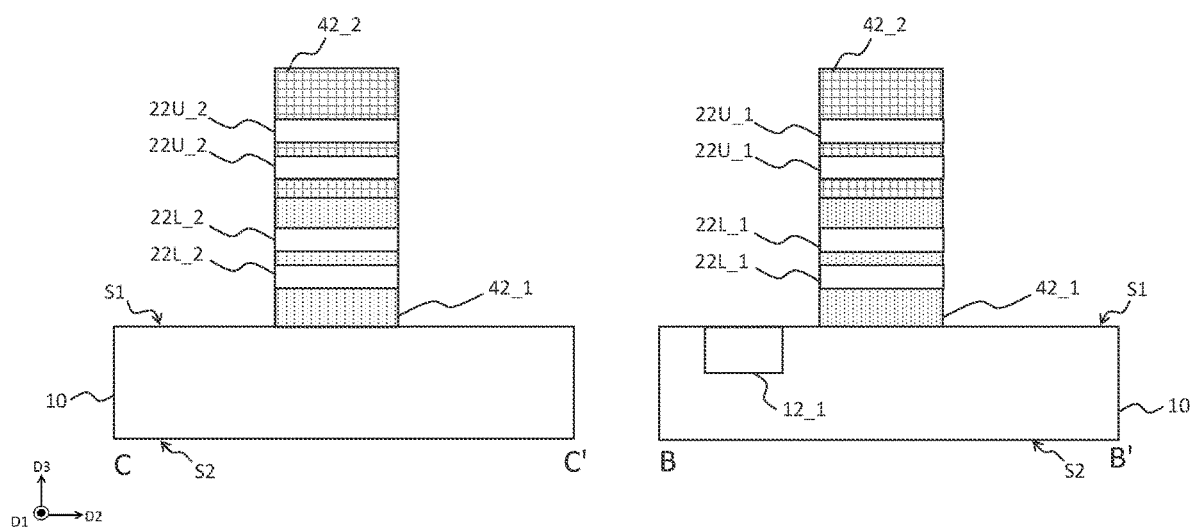
FIGS. 21-23 are cross-sectional views taken along the line B-B' and the line C-C' in FIG. 4 illustrating methods of forming an integrated circuit device according to some embodiments of the present invention.
Figure 22:
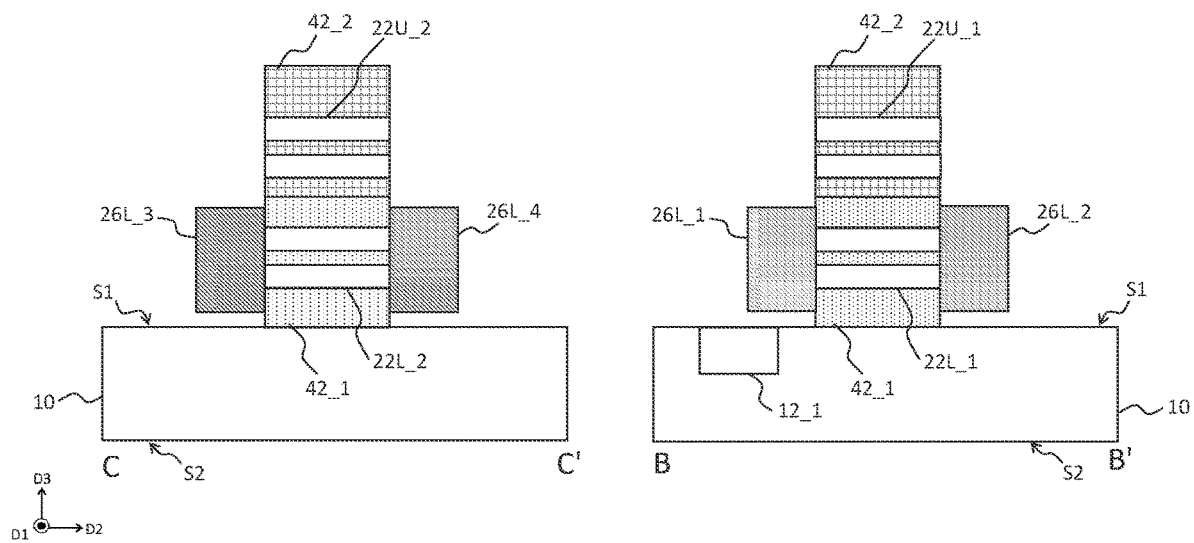
Figure 23:
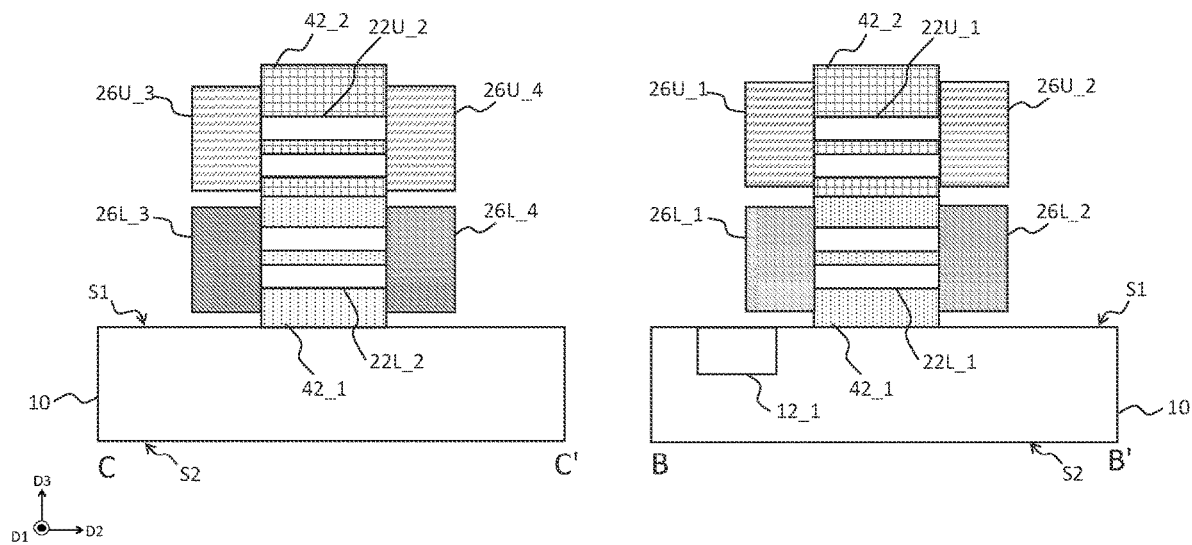

FIG. 20 is a flow chart of methods of forming an integrated circuit device according to some embodiments of the present invention. FIGS. 21-23 are cross-sectional views taken along the line B-B' and the line C-C' in FIG. 4 illustrating methods of forming an integrated circuit device according to some embodiments of the present invention.

Referring to FIGS. 20 and 21, the methods may include forming a doped portion (e.g., the first portion 12_1 of the substrate 10 in FIG. 5) in a substrate 10 (Block 1000) by adding impurities (e.g., boron, aluminum, gallium, indium, phosphorus, and/or arsenic) to the substrate 10. For example, an ion implantation process and/or a diffusion process may be used to form the doped portion. The methods may also include forming a lower thin semiconductor layer 22L_1 (also referred to as a first lower thin semiconductor layer) and a lower active layer 22L_2 (also referred to as a second lower thin semiconductor layer) on the substrate 10 (Block 1100).

In some embodiments, each of the lower thin semiconductor layer 22L_1 and the lower active layer 22L_2 may include multiple layers (e.g., two layers as illustrated in FIG. 21) stacked in the third direction D3. In some embodiments, one of the lower thin semiconductor layers 22L_1 and one of the lower active layers 22L_2 may be formed concurrently at the same height from the first surface S1 of the substrate 10 as illustrated in FIG. 21. For example, preliminary lower semiconductor layers may be formed on the substrate 10 and then the preliminary lower semiconductor layers may be patterned, thereby forming the lower thin semiconductor layers 22L_1 and the lower active layers 22L_2. One of the lower thin semiconductor layers 22L_1 and one of the lower active layers 22L_2, which have lower surfaces coplanar with each other, may be respective portions of a single preliminary lower semiconductor layer. First interlayer insulating layers 42_1 may be formed to be stacked alternately with the lower thin semiconductor layers 22L_1 and the lower active layers 22L_2 and may expose opposing side surfaces of the lower thin semiconductor layers 22L_1 and the lower active layers 22L_2.

An upper thin semiconductor layer 22U_1 (also referred to as a first upper thin semiconductor layer) and an upper active layer 22U_2 (also referred to as a second upper thin semiconductor layer) may be formed on the lower thin semiconductor layer 22L_1 and the lower active layer 22L_2, respectively (Block 1200). In some embodiments, each of the upper thin semiconductor layer 22U_1 and the upper active layer 22U_2 may include multiple layers (e.g., two layers as illustrated in FIG. 21) stacked in the third direction D3. In some embodiments, one of the upper thin semiconductor layers 22U_1 and one of the upper active layers 22U_2 may be formed concurrently at the same height from the first surface S1 of the substrate 10 as illustrated in FIG. 21. For example, preliminary upper semiconductor layers may be formed on the substrate 10 and then the preliminary upper semiconductor layers may be patterned, thereby forming the upper thin semiconductor layers 22U_1 and the upper active layers 22U_2. One of the upper thin semiconductor layers 22U_1 and one of the upper active layers 22U_2, which have lower surfaces coplanar with each other, may be respective portions of a single preliminary upper semiconductor layer. Second interlayer insulating layer 42_2 may be formed to be stacked alternately with the upper thin semiconductor layer 22U_1 and the upper active layer 22U_2 and may expose opposing side surfaces of the upper thin semiconductor layer 22U_1 and the upper active layer 22U_2.

Referring to FIGS. 18 and 22, lower semiconductor layers 26L_1 and 26L_2 (also referred to as first and second lower semiconductor layers) and lower source/drain regions 26L_3 and 26L_4 (also referred to as third and fourth lower semiconductor layers) may be formed (Block 1300). In some embodiments, the first and second lower semiconductor layers 26L_1 and 26L_2 may be formed by an epitaxial growth process using the lower thin semiconductor layer 22L_1 as a seed layer, and the lower source/drain regions 26L_3 and 26L_4 may be formed by an epitaxial growth process using the lower active layer 22L_2 as a seed layer. In some embodiments, the first and second lower semiconductor layers 26L_1 and 26L_2 and the lower source/drain regions 26L_3 and 26L_4 may be formed by a single epitaxial growth process (e.g., a first epitaxial growth process).

Opposing side surfaces of the lower thin semiconductor layer 22L_1 may contact the first and second lower semiconductor layers 26L_1 and 26L_2, respectively, and opposing side surfaces of the lower active layer 22L_2 may contact the lower source/drain regions 26L_3 and 26L_4, respectively, as illustrated in FIG. 22.

Although FIG. 22 illustrates that the first and second lower semiconductor layers 26L_1 and 26L_2 and the lower source/drain regions 26L_3 and 26L_4 are formed after the upper thin semiconductor layers 22U_1 and the upper active layers 22U_2 are formed, in some embodiments, the lower source/drain regions 26L_3 and 26L_4 may be formed before the upper thin semiconductor layers 22U_1 and the upper active layers 22U_2 are formed.

Referring to FIGS. 18 and 23, upper semiconductor layers 26U_1 and 26U_2 (also referred to as first and second upper semiconductor layers) and upper source/drain regions 26U_3 and 26U_4 (also referred to as third and fourth upper semiconductor layers) may be formed (Block 1400). In some embodiments, the upper semiconductor layers 26U_1 and 26U_2 may be formed by an epitaxial growth process using the upper thin semiconductor layer 22U_1 as a seed layer, and the upper source/drain regions 26U_3 and 26U_4 may be formed by an epitaxial growth process using the upper active layer 22U_2 as a seed layer. In some embodiments, the upper semiconductor layers 26U_1 and 26U_2 and the upper source/drain regions 26U_3 and 26U_4 may be formed by a single epitaxial growth process (e.g., a second epitaxial growth process).

Referring to FIGS. 4 to 6, 16 and 18, the methods may include forming resistor contacts (e.g., the first and second contact 32_1 and 32_2) and source/drain contacts (e.g., fifth, seventh and eight contacts 32_5, 32_7 and 32_8) (Block 1500) and forming a first metal layer 24_1 and a second metal layer 24_2 (Block 1600). In some embodiments, portions of the first and second interlayer insulating layers 42_1 and 42_2 may be replaced with the first metal layer 24_1 and the second metal layer 24_2. In some embodiments, the resistor contacts and the source/drain contacts may be formed concurrently. For example, the resistor contacts and the source/drain contacts may include the same metal layer formed by the same deposition process. In some embodiments, the resistor contacts and the source/drain contacts may have upper surfaces coplanar with each other.

In some embodiments, the first metal layer 24_1 and the second metal layer 24_2 may be formed concurrently. For example, first metal layer 24_1 and the second metal layer 24_2 may include the same metal layer formed by the same deposition process.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. A resistor structure comprising:
    a substrate;
    an upper semiconductor layer that is spaced apart from the substrate in a vertical direction;
    a lower semiconductor layer that is between the substrate and the upper semiconductor layer and spaced apart in the vertical direction from the substrate and from the upper semiconductor layer;
    an insulating layer that is between the upper semiconductor layer and the lower semiconductor layer; and
    first and second resistor contacts that are spaced apart from each other in a horizontal direction,
    wherein at least one of the upper semiconductor layer, the lower semiconductor layer, and a portion of the substrate contacts the first and second resistor contacts.

2. The resistor structure of claim 1, wherein both the upper semiconductor layer and the lower semiconductor layer contact the first and second resistor contacts.

3. The resistor structure of claim 2, wherein the portion of the substrate contacts the first and second resistor contacts.

4. The resistor structure of claim 1, wherein the portion of the substrate is a first portion of the substrate, and the substrate further comprises a second portion,
    the upper semiconductor layer is a first upper semiconductor layer, and the lower semiconductor layer is a first lower semiconductor layer, and
    the resistor structure further comprises:
        a second upper semiconductor layer that is spaced apart from the first upper semiconductor layer in the horizontal direction;
        a second lower semiconductor layer that is between the substrate and the second upper semiconductor layer; and
        a third resistor contact that is spaced apart from the second resistor contact in the horizontal direction,
        wherein at least one of the second upper semiconductor layer, the second lower semiconductor layer, and the second portion of the substrate contacts the second and third resistor contacts.

5. The resistor structure of claim 4, wherein both the second upper semiconductor layer and the second lower semiconductor layer contact the second and third resistor contacts.

6. The resistor structure of claim 5, wherein the second portion of the substrate contacts the second and third resistor contacts.

7. The resistor structure of claim 1, wherein the upper semiconductor layer is spaced apart from at least one of the first and second resistor contacts.

8. The resistor structure of claim 1, wherein the lower semiconductor layer is spaced apart from at least one of the first and second resistor contacts.

9. The resistor structure of claim 1, wherein the horizontal direction is a first horizontal direction, and
    the resistor structure further comprises:
        an upper thin semiconductor layer protruding from a side surface of the upper semiconductor layer in a second horizontal direction that is different from the first horizontal direction;
        a lower thin semiconductor layer protruding from a side surface of the lower semiconductor layer in the second horizontal direction; and
        a metal layer that is spaced apart from the upper semiconductor layer in the second horizontal direction, and a portion of the upper thin semiconductor layer or a portion of the lower thin semiconductor layer is in the metal layer.

10. The resistor structure of claim 1, wherein the horizontal direction is a first horizontal direction,
    the upper semiconductor layer is one of a pair of upper semiconductor layers that are spaced apart from each other in a second horizontal direction that is different from the first horizontal direction, and the lower semiconductor layer is one of a pair of lower semiconductor layers that are spaced apart from each other in the second horizontal direction, and
    the resistor structure further comprises:
        an upper thin semiconductor layer contacting the pair of upper semiconductor layers; and a lower thin semiconductor layer contacting the pair of lower semiconductor layers.

11. An integrated circuit device comprising:
the resistor structure of claim 1; and
a stacked transistor structure comprising:
an upper transistor comprising an upper source/drain region; and
a lower transistor that is between the substrate and the upper transistor and comprises a lower source/drain region,
wherein the upper semiconductor layer and the upper source/drain region comprise a same material and have an equal thickness in the vertical direction, and the lower semiconductor layer and the lower source/drain region comprise a same material and have an equal thickness in the vertical direction.

12. A resistor structure comprising:
a substrate;
an upper semiconductor layer that is spaced apart from the substrate in a vertical direction;
a lower semiconductor layer that is between the substrate and the upper semiconductor layer;
an upper thin semiconductor layer protruding from a side surface of the upper semiconductor layer in a horizontal direction; and
a lower thin semiconductor layer protruding from a side surface of the lower semiconductor layer in the horizontal direction,
wherein the lower thin semiconductor layer is between the substrate and the upper thin semiconductor layer, and
wherein at least two of the upper semiconductor layer, the lower semiconductor layer, and a portion of the substrate are configured to function as respective resistors that are connected in parallel.

13. The resistor structure of claim 12, wherein all of the upper semiconductor layer, the lower semiconductor layer, and the portion of the substrate are configured to function as respective resistors that are connected in parallel.

14. The resistor structure of claim 12, wherein the horizontal direction is a first horizontal direction, and
the resistor structure further comprises first and second resistor contacts that are spaced apart from each other in a second horizontal direction that is different from the first horizontal direction, and
wherein the at least two of the upper semiconductor layer, the lower semiconductor layer, and the portion of the substrate contact the first and second resistor contacts.

15. The resistor structure of claim 12, further comprising:
a metal layer that is spaced apart from the upper semiconductor layer in the horizontal direction, wherein a portion of the upper thin semiconductor layer or a portion of the lower thin semiconductor layer is in the metal layer.

16. A method of forming an integrated circuit device, the method comprising:
forming a resistor structure, wherein forming the resistor structure comprises:
forming a lower thin semiconductor layer and an upper thin semiconductor layer on a substrate, wherein the lower thin semiconductor layer is spaced apart from the substrate in a vertical direction and is between the substrate and the upper thin semiconductor layer;
forming a lower semiconductor layer by performing a first epitaxial growth process using the lower thin semiconductor layer as a first seed layer;
forming an upper semiconductor layer by performing a second epitaxial growth process using the upper thin semiconductor layer as a second seed layer; and
forming first and second resistor contacts that are spaced apart from each other in a horizontal direction and contact at least one of the upper semiconductor layer, the lower semiconductor layer, and a portion of the substrate.

17. The method of claim 16, further comprising:
adding impurities to the portion of the substrate, wherein the portion of the substrate contacts the first and second resistor contacts.

18. The method of claim 16, wherein the lower semiconductor layer and the upper semiconductor layer have different conductivity types.

19. The method of claim 16, further comprising forming a stacked transistor structure, wherein forming the stacked transistor structure comprises:
forming a lower active layer and an upper active layer on the substrate, wherein the lower active layer is spaced apart from the substrate in the vertical direction and is between the substrate and the upper active layer;
forming a lower source/drain region by performing the first epitaxial growth process using the lower active layer as a third seed layer; and
forming an upper source/drain region by performing the second epitaxial growth process using the upper active layer as a fourth seed layer.

20. The method of claim 19, wherein forming the stacked transistor structure further comprises forming a source/drain contact that contacts the upper source/drain region, and an upper surface of the source/drain contact is coplanar with upper surfaces of the first and second resistor contacts.

* * * * *